United States Patent
Tsuchida et al.

(10) Patent No.: US 6,835,241 B2
(45) Date of Patent: Dec. 28, 2004

(54) SURFACE TREATMENT FOR COPPER FOIL

(75) Inventors: Katsuyuki Tsuchida, Kitaibaraki (JP); Masashi Kumagai, Hitachi (JP); Fumiaki Akase, Hitachi (JP)

(73) Assignee: Nikko Materials Co., Ltd., Tokyo (JP)

( * ) Notice: Subject to any disclaimer, the term of this patent is extended or adjusted under 35 U.S.C. 154(b) by 5 days.

(21) Appl. No.: 10/362,953

(22) PCT Filed: Jul. 17, 2002

(86) PCT No.: PCT/JP02/07256

§ 371 (c)(1),
(2), (4) Date: May 1, 2003

(87) PCT Pub. No.: WO03/035930

PCT Pub. Date: May 1, 2003

(65) Prior Publication Data
US 2004/0149167 A1 Aug. 5, 2004

(30) Foreign Application Priority Data
Oct. 18, 2001 (JP) ........................ 2001-320394

(51) Int. Cl.$^7$ ........................... C09D 183/10
(52) U.S. Cl. ............ 106/287.15; 106/287.14; 428/447; 428/450
(58) Field of Search .............. 106/287.14, 287.15; 428/447, 450

(56) References Cited

U.S. PATENT DOCUMENTS 5,258,522 A * 11/1993 Tsuchida et al. ............ 548/110

FOREIGN PATENT DOCUMENTS

| JP | 07-326861 | 12/1995 |
|----|-----------|---------|
| JP | 08-295736 | 11/1996 |
| JP | 09-194872 | 7/1997 |
| JP | 09/241576 | 9/1997 |
| JP | 2002-069661 | 3/2002 |

* cited by examiner

Primary Examiner—David Brunsman
(74) Attorney, Agent, or Firm—Flynn, Thiel, Boutell & Tanis, P.C.

(57) ABSTRACT

The present invention provides a surface treatment agent that endows a copper foil with excellent adhesion to insulating resins.

The surface treatment agent of the present invention has as its active components an organosilicic compound expressed by a following General Formula (1) and/or an organosilicic compound expressed by a General Formula (2) and an olefin-based silane coupling agent. The surface treatment agent of the present invention provides particularly excellent adhesion between an insulating resin and a low-profile copper foil used for a high-frequency-adaptable substrate.

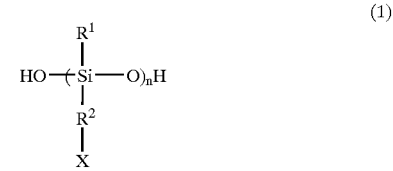

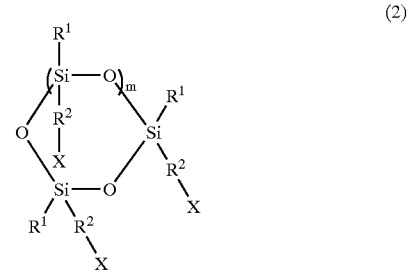

In Formulas (1) and (2), $R^1$ is a hydroxyl group or a $C_1$ to $C_5$ alkyl group, and $R^2$ is a $C_1$ to $C_{10}$ alkylene group that may contain oxygen.

4 Claims, No Drawings

SURFACE TREATMENT FOR COPPER FOIL

This application is a 371 of PCT/JP02/07256, filed 17 Jul. 2002.

TECHNICAL FIELD

This invention relates to a copper foil surface treatment agent which increases the adhesion between the copper foil and an insulating resin. More particularly, the invention relates to a copper foil surface treatment agent that provides excellent adhesion between an insulating resin and a low-profile copper foil used on high-frequency-adaptable substrates.

BACKGROUND ART

As computers and communication devices have improved in their performance and functions and such computers and devices become increasingly network-oriented in recent years, the signals trend toward higher frequencies for the high-speed transmission of large volumes of information.

Because of their excellent adhesion characteristics, epoxy resins have been used fairly widely for the insulating materials of printed wiring boards. However, epoxy resins generally have a high dielectric constant or dielectric tangent and thus unsatisfactory high frequency characteristics. A resin with excellent dielectric characteristics has to be used in order to cope with the high-frequency signals used in the above-mentioned communication field. But resins with low dielectric constant or dielectric tangent have few functional groups with high polarity that contribute to adhesion, so the adhesion characteristics of the resins tend to suffer. Then, improvement is need on this front.

Also, the copper foil for a high-frequency-adaptable substrate needs to have as little surface roughness as possible, that is, to be low-profile. The reason that this lower profile is preferable for a copper foil is theorized that electric current flow becomes concentrated in the surface of a copper foil as the signal frequency rises (this is called the epidermal effect), meaning that the surface roughness of a copper foil greatly affects transmission loss.

Therefore, with a high-frequency-adaptable substrate, due both to the change in resin and to the lower profile of the copper foil, the adhesive strength between the copper foil and the insulating resin is lower, and there is an urgent need for improvement of this adhesion.

Standard means employed for improving the adhesion between an insulating resin and a copper foil of a high-frequency-adaptable substrate are a surface treatment of a copper foil with a silane coupling agent, or addition of a silane coupling agent to the resin. The inventors have already disclosed in Japanese Patent Publication H8-295736 a silane coupling agent whose active components are specific organosilicic compounds expressed by General Formulas (1) and (2) given below. In addition, commercially available epoxy-based and amino-based silane coupling agents are effective, and have been in use for many years. But, the cases that the required characteristics cannot be achieved increase in the above-mentioned higher frequency applications of today.

DISCLOSURE OF THE INVENTION

Therefore, an object of the present invention is to provide a copper foil surface treatment agent with which an insulating resin and a copper foil used for a printed wiring board can be securely bonded together. More particularly, an object of the present invention is to provide a copper foil surface treatment agent that is effective even with low-profile copper foils and insulating resins used in high-frequency-adaptable substrates.

As a result of diligent research aimed at improving the adhesion between a copper foil and an insulating resin, the inventors discovered that the above-mentioned problems can be solved by combining a specific organosilicic compound with an olefin-based silane coupling agent. In particular, it was discovered that an aqueous solution whose active components are an organosilicic compound expressed by the following General Formula (1) and/or (2) and an olefin-based silane coupling agent is favorable as a copper foil surface treatment agent for a high-frequency-adaptable substrate, thereby, the adhesive strength between the insulating substrate and the copper foil can be dramatically increased. Specifically, the present invention provides the copper foil surface treatment agent and copper foil of [1] to [4] below.

[1] A copper foil surface treatment agent, comprising an olefin-based silane coupling agent and an organosilicic compound expressed by a following General Formula (1) and/or an organosilicic compound expressed by a General Formula (2) as active components thereof:

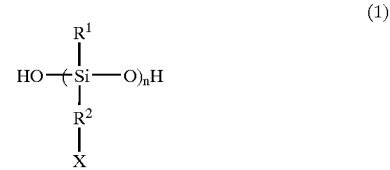

(1)

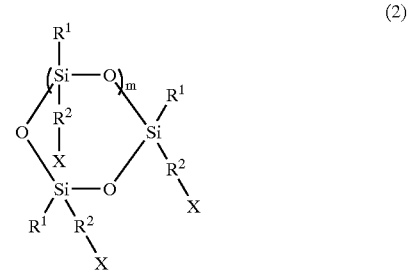

(2)

wherein, in the Formulas (1) and (2), $R^1$ is a hydroxyl group or a $C_1$ to $C_5$ alkyl group, $R^2$ is a $C_1$ to $C_{10}$ alkylene group that optionally contains oxygen, X is

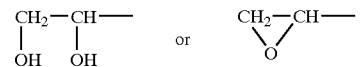

including the former group having two hydroxyl groups produced by cleavage of an epoxy group, n is an integer of at least 2, and m is an integer of at least 1.

[2] A copper foil surface treatment agent comprising a solution as an active component, said solution being obtained by stirring an organosilicic compound having an epoxy group expressed by a following General Formula (3) under heating in an aqueous solution, returning said solution to room temperature, adding an olefin-based silane coupling agent and stirring:

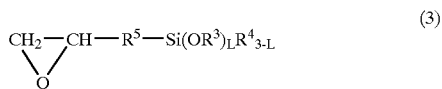
(3)

wherein $R^3$ is a $C_1$ to $C_5$ alkyl group, $R^4$ is a hydroxyl group or a $C_1$ to $C_5$ alkyl group, $R^5$ is a single bond or a $C_1$ to $C_{10}$ alkyl group that optionally contains oxygen, and L is 2 or 3.

[3] A copper foil being surface treated with the copper foil surface treatment agent according to [1] or [2] above.

[4] The copper foil according to [3] above, wherein said copper foil is a low-profile copper foil whose surface roughness (Rz) is 3.5 μm or less.

The mechanism by which adhesion between a copper foil and an insulating resin is improved with applying the surface treatment agent of the present invention is theorized to be as follows: First, because the organosilicic compound expressed by the above-mentioned General Formula (1) and/or (2) is an oligomer component, it readily sticks to a copper foil; Next, it is accepted that adhesion between the copper foil and the insulating resin strengthens when the olefin-based silane coupling agent reacts with the insulating resin, and also reacts with the organosilicic compound expressed by the above-mentioned General Formula (1) and/or (2).

The improvement in adhesion between the copper foil and the insulating resin will be inadequate if just the organosilicic compound expressed by the above-mentioned General Formula (1) and/or (2) or just the olefin-based silane coupling agent is used alone. Research on the part of the inventors has confirmed that particularly good adhesive strength can be obtained by combining the two of these (the organosilicic compound expressed by the above-mentioned General Formula (1) and/or (2) and the olefin-based silane coupling agent).

The constitution of the present invention will now be described.

The surface treatment agent of the present invention contains an organosilicic compound expressed by the above-mentioned General Formula (1) and/or (2), and, in addition, may also contain an intermolecular condensate produced through a condensation reaction between the .Si.OH groups of these compounds. Also, in the above-mentioned General Formulas (1) and (2), n is at least 2, and preferably 2 to 50, and m is at least 1, and preferably 1 to 50. Stability is highest when m=2.

As will be described below, the organosilicic compound expressed by General Formula (1) or (2) is obtained by heating and stirring a compound expressed by General Formula (3). In General Formula (3), $R^3$ is a $C_1$ to $C_5$ alkyl group, but from the standpoint of ease of hydrolysis, an alkyl group with one or two carbons is preferable. In terms of solubility in water, $R^4$ preferably has one or two carbons. If L is 2 or 3, the hydrolysis and condensation of alkoxysilyl groups will proceed so the effect of the present invention will be satisfactorily achieved. Furthermore, L=3 is particularly favorable, because the greater is the number of alkoxysilyl groups, the more hydrolysis and condensation will occur and the greater will be the reactivity with other silane coupling agents or copper foils, so the large value of n in General Formula (1) is better. The effect of the present invention will be satisfactorily achieved if $R^5$ is a single bond or a $C_1$ to $C_{10}$ alkylene group. However, the greater the carbon number, the more hydrophobic the product will be and the more water solubility will decrease, so a $C_1$ to $C_5$ alkylene group is preferred. $R^5$ may also have an ether bond included in the alkylene group. The followings are examples of the organosilicic compounds having epoxy groups.

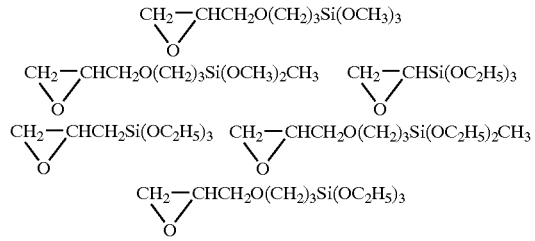

The organosilicic compound expressed by the above-mentioned General Formula (1) and/or (2) is obtained by stirring the organosilicic compound having epoxy groups expressed by the above-mentioned General Formula (3) in an aqueous solution and under heating. The organosilicic compound having epoxy groups used in the present invention and being expressed by General Formula (3) is stirred in a 40 to 90° C. aqueous solution here. It was confirmed from NMR measurement results that the compound partially cleaves the epoxy groups and produces hydroxyl groups, as shown in the following reaction formula (4).

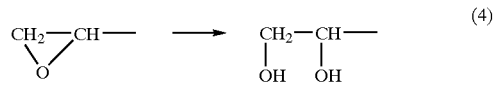
(4)

It was also confirmed from liquid chromatography measurement results that a trialkoxysilyl group is condensed into a siloxane oligomer following hydrolysis, as shown in the following reaction formula (5). Specifically, it can be seen that the organosilicic compound expressed by General Formula (1) and the compound expressed by General Formula (2) are produced as a mixture of these.

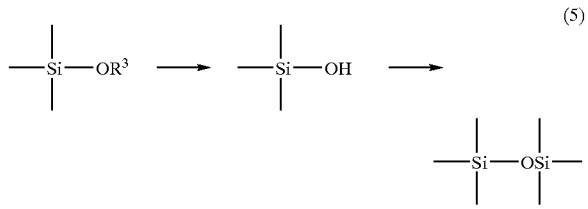
(5)

When the surface treatment agent of the present invention is applied on a copper foil, the hydroxyl groups produced as above connect to the resin or copper foil with hydrogen bonds, and furthermore evaporation during the heat treatment following the surface treatment is suppressed by the siloxane oligomer, the coating amount on the copper foil increases. Thereby, the adhesive strength between the copper foil and the resin is improved. The organosilicic compound expressed by General Formula (1) and the organosilicic compound expressed by General Formula (2) are usually both produced by heating and stirring the compound expressed by General Formula (3), forming a mixture. The mixture thus obtained can be used just as it is as the active component of the surface treatment agent of the present invention, with no particular need for separation and refining.

As mentioned above, it is preferable to heat to a temperature between 40 and 90° C. for the reaction producing the siloxane oligomer and hydroxyl groups. The reaction will be too slow under 40° C. On the other hand, if 90° C. is exceeded, the aqueous solution will turn into a gel because the trialkoxysilyl groups undergo excessive hydrolysis and condensation. Owing to consideration of all of this together, the stirring temperature is preferably between 60 and 85° C. Acetic acid, hydrochloric acid, or another such acid, or ammonia or another such alkali solution may be added in order to control the production of siloxane oligomer and hydroxyl groups. The reaction will proceed further and adhesive will increase if the above-mentioned aqueous solution is stirred for a longer time, but the effect of the present invention will be sufficiently achieved by stirring for at least 2 hours.

Examples of the olefin-based silane coupling agent used in the present invention include vinyl-based silanes, acrylic-based silanes, and methacrylic-based silanes.

Of these, vinyl-based silanes include vinyltrichlorosilane, vinyltrialkoxysilanes, and vinyldialkoxyalkylsilanes, such as vinyltrimethoxysilane, vinyltriethoxysilane, vinyltris (β-methoxyethoxy) silane, vinyldimethoxymethylsilane, and vinyldiethoxymethylsilane. Acrylic-based silanes include γ-acryloxypropyltrimethoxysilane. Methacrylic-based silanes include γ-methacryloxypropyltrimethoxysilane, γ-methacryloxypropylmethyldimethoxysilane, γ-methacryloxypropylmethyldiethoxysilane, and γ-methacryloxypropyltriethoxysilane. Out of these, vinyl-based silanes are preferred, and vinyltrimethoxysilane and vinyltriethoxysilane are particularly favorable.

In the surface treatment agent of the present invention, the ratio in which the organosilicic compound expressed by General Formula (1) and/or (2) and the olefin-based silane coupling agent are mixed can be varied over a range of 99:1 to 1:99 and a range of 5:95 to 70:30 is preferable.

The surface treatment agent of the present invention is diluted with water, an aqueous solution added acetic acid or the like so as to be weakly acidic, or another such diluent, such that the total amount of the active components, namely, the organosilicic compound expressed by General Formula (1) and/or (2) and the olefin-based silane coupling agent, are contained in an amount of 0.01 to 10 wt %, and preferably 0.01 to 6 wt %. For the surface treatment of the copper foil, dipping the foil in this solution, spraying the solution onto its surface, or coating its surface by another such method is preferable because of simplicity. After the copper foil has been coated, the water will evaporate enough for the effect of the present invention to be adequately obtained. Especially, drying at 50 to 180° C. is preferable because this process accelerates the reaction between the silane coupling agent and the copper foil.

The surface treatment agent of the present invention can also contain suitable additives as needed, such as other silane coupling agents, pH regulators, and buffers.

There are no particular restrictions on the copper foil to which the surface treatment agent of the present invention can be applied, and either an electrolytic copper foil or a rolled copper foil can be used. The foil may also undergo a roughening treatment or rustproofing treatment as dictated by the application. A roughening treatment is a step in which fine copper particles are deposited. However, for a high-frequency-adaptable substrate, it is preferable for the surface roughness of the copper foil to be as low as possible, so no roughening treatment need be performed. A copper foil whose surface roughness (Rz) is no more than 3.5 μm, and preferably no more than 3 μm, is good for a high-frequency-adaptable substrate. To this end, it is important to balance well roughening particles with undulations on the surface of the copper foil. The surface roughness referred to in this Specification is the surface roughness Rz stipulated in JIS B 0601. The rustproofing treatment to which the copper foil is subjected can be an inorganic rustproofing treatment with zinc, a zinc alloy, a chromate, or the like. The zinc alloy is preferably an alloy of zinc and nickel, cobalt, copper, chromium, or another such metal, or a mixture of these.

The effect of the present invention will be adequately achieved as long as the insulating resin used along with the copper foil which is treated with the surface treatment agent of the present invention is a high-frequency-adaptable insulating resin whose curing system involves double bonds, or an insulating resin whose curing system involves double bonds. Especially, the surface treatment agent of the present invention is suitable for a high-frequency-adaptable insulating resin because of the great need for improvement in peel strength.

Examples of an insulating resin whose curing system involves double bonds include thermosetting polyphenylene ether resins, thermosetting polyphenylene ether resins containing a polystyrene polymer, resin compositions containing a triallyl cyanurate polymer or copolymer, acrylic or methacrylic modified epoxy resin compositions, phenol-added butadiene polymers, diallyl phthalate resins, divinylbenzene resins, polyfunctional methacryloyl resins, unsaturated polyester resins, polybutadiene resins, crosslinked polymers such as styrene-butadiene, styrene-butadiene.styrene-butadiene. These resins are not limited to single compound, and a variety of other substances may be added or the resins may be modified in order to obtain the desired characteristics. A thermoplastic resin may also be blended with the thermosetting resin. Further, the above-mentioned thermosetting resins may contain fillers and additives.

BEST MODE FOR CARRYING OUT THE INVENTION

The present invention will now be described through examples and comparative examples, but the present invention is not limited by these examples. All references to "%" below mean weight percent.

Synthesis of High-temperature Stirred Epoxysilane

To begin, the method for producing a high-temperature stirred epoxysilane as the organosilicic compound expressed by General Formula (1) and/or (2) of the present invention will be described. This high-temperature stirred epoxysilane was used in the examples given below. First, γ-glycidoxypropyltrimethoxysilane was added in an amount of 4% to pure water that had been adjusted to a pH of 5 with acetic acid. This solution was stirred for 24 hours while maintained at 85° C. $^{13}$C-NMR, $^{29}$Si-NMR, and aqueous GPC measurement results confirmed that the epoxy rings were completely opened, and that the trimethoxysilyl groups of the γ-glycidoxypropyltrimethoxysilane had hydrolyzed and condensed to produce a siloxane oligomer. Specifically, these analysis results revealed that the reaction product obtained by stirring an aqueous solution of γ-glycidoxypropyltrimethoxysilane while heating comprised the organosilicic compound expressed by General Formula (1) and the organosilicic compound expressed by General Formula (2) produced through the self-condensation and cyclization of the first-mentioned organosilicic compound.

Surface Treatment of Copper Foil

An electrolytic copper foil was prepared in a thickness of 18 μm, the matte side was subjected to a roughening treatment, and a brass layer was formed on the side. After this, the copper foil was plated with a zinc-chromium mixture of zinc or zinc oxide and chromium oxide. The surface roughness (Rz) of this plating was 3.0 to 3.5 μm. This plated copper foil was surface treated as follows with surface treatment agents ① to ④ used respectively in Examples 1 to 2 and Comparative Examples 1 to 2. The surface treatment involved first dropping a small amount of surface treatment agent onto the copper foil, then coating the copper foil with the surface treatment agent using a revolving SUS roll. After coating, the copper foil was dried for 5 minutes at 100° C.

EXAMPLE 1

In Example 1, a copper foil was surface treated according to the "Surface Treatment of Copper Foil" above, using the following surface treatment agent ①.

① A solution obtained by the following steps: diluting a 4% high-temperature stirred epoxysilane synthesized according to the above section entitled "Synthesis of High-Temperature Stirred Epoxysilane" 40 times with a solution prepared by adding acetic acid to pure water to adjust the pH to 5; adding vinyltriethoxysilane in an amount of 0.3%; and then stirring 12 hours (0.1% high-temperature stirred epoxysilane/0.3% vinyltriethoxysilane).

Adhesion Test

The copper foil surface-treated as above was hot-pressed with a glass fiber substrate that had been impregnated with a liquid including polyphenylene ether as the main component, thereby producing a copper-clad laminate. This copper-clad laminate was measured for steady state peel strength by the method defined in JIS C 6481. The results of this test are given in Table 1 below.

EXAMPLE 2

In Example 2, a copper foil was surface treated in the same manner as in Example 1, except that the following surface treatment agent ② was used. After this, the copper foil was subjected to the same adhesion test as in Example 1. The evaluation results are given in Table 1 below.

② A solution obtained by the following steps: diluting a 4% high-temperature stirred epoxysilane synthesized according to the above section entitled "Synthesis of High-Temperature Stirred Epoxysilane" 20 times with a solution prepared by adding acetic acid to pure water to adjust the pH to 5; adding vinyltriethoxysilane in an amount of 0.2%; and then stirring 12 hours (0.2% high-temperature stirred epoxysilane/0.2% vinyltriethoxysilane).

Compartive Example 1

In Comparative Example 1, a copper foil was surface treated in the same manner as in Example 1, except that the following surface treatment agent ③ was used. After this, the copper foil was subjected to the same adhesion test as in Example 1. The evaluation results are given in Table 1 below.

③ A solution obtained by diluting the above-mentioned 4% high-temperature stirred epoxysilane 10 times with a solution prepared by adding acetic acid to pure water to adjust the pH to 5 (0.4% high-temperature stirred epoxysilane).

Compartive Example 2

In Comparative Example 2, a copper foil was surface treated in the same manner as in Example 1, except that the following surface treatment agent ④ was used. After this, the copper foil was subjected to the same adhesion test as in Example 1. The evaluation results are given in Table 1 below.

④ A solution obtained by adding vinyltriethoxysilane in an amount of 0.4% to a solution prepared by adding acetic acid to pure water to adjust the pH to 5, and then stirring for 12 hours (0.4% vinyltriethoxysilane).

TABLE 1

|  | Surface treatment agent | Steady state peel strength (kg/cm) |
|---|---|---|
| Example 1 | 0.1% high-temperature stirred epoxysilane/ 0.3% vinyltriethoxysilane | 0.73 |
| Example 2 | 0.2% high-temperature stirred epoxysilane/ 0.2% vinyltriethoxysilane | 0.65 |
| Comparative Example 1 | 0.4% high-temperature stirred epoxysilane | 0.21 |
| Comparative Example 2 | 0.4% vinyltriethoxysilane | 0.50 |

As is clear from Table 1, it was confirmed that the peel strength was higher in Examples 1 and 2, in which a mixed surface treatment agent of high-temperature stirred epoxysilane and vinylsilane was used, than in Comparative Examples 1 and 2, in which a surface treatment agent comprising each of these silanes alone was used.

Industrial Applicability

The use of the surface treatment agent of the present invention imparts excellent adhesion to an insulating resin and a copper foil. In particular, if the surface treatment agent of the present invention is applied to a low-profile copper foil suited to high-frequency-adaptable substrates, excellent adhesion to insulating resins that was impossible with a conventional treatment agent can be realized.

What is claimed is:

1. A copper foil surface treatment agent, comprising an olefin-based silane coupling agent and an organosilicic compound expressed by a following General Formula (1) and/or an organosilicic compound expressed by a General Formula (2) as active components thereof:

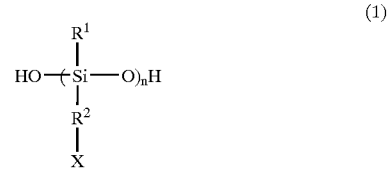

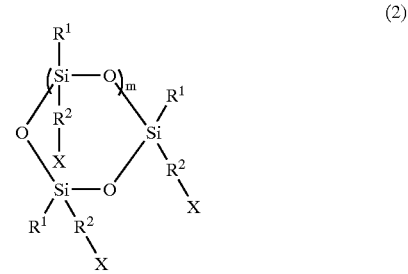

wherein, in the Formulas (1) and (2), $R^1$ is a hydroxyl group or a $C_1$ to $C_5$ alkyl group, $R^2$ is a $C_1$ to $C_{10}$ alkylene group that optionally contains oxygen, X is

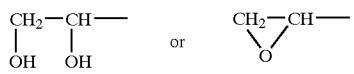
or
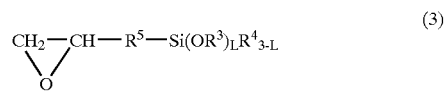

including the former group having two hydroxyl groups produced by cleavage of an epoxy group, n is an integer of at least 2, and m is an integer of at least 1.

2. A copper foil surface treatment agent comprising a solution as an active component, said solution being obtained by stirring an organosilicic compound having an epoxy group expressed by a following General Formula (3) under heating in an aqueous solution, returning said solution to room temperature, adding an olefin-based silane coupling agent and stirring:

$$CH_2-CH-R^5-Si(OR^3)_L R^4_{3-L} \quad (3)$$

wherein $R^3$ is a $C_1$ to $C_5$ alkyl group, $R^4$ is a hydroxyl group or a $C_1$ to $C_5$ alkyl group, $R^5$ is a single bond or a $C_1$ to $C_{10}$ alkyl group that optionally contains oxygen, and L is 2 or 3.

3. A copper foil being surface treated with the copper foil surface treatment agent according to claim 1.

4. The copper foil according to claim 3, wherein said copper foil is a low-profile copper foil whose surface roughness (Rz) is 3.5 μm or less.

* * * * *